United States Patent
Chung et al.

(10) Patent No.: US 10,824,841 B2
(45) Date of Patent: Nov. 3, 2020

(54) UNDER-SCREEN FINGERPRINT IDENTIFICATION SYSTEM

(71) Applicant: Guangzhou Tyrafos Semiconductor Technologies Co., LTD, Guangzhou (CN)

(72) Inventors: Jun-Wen Chung, Tainan (TW); Ping-Hung Yin, Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 0 days.

(21) Appl. No.: 16/505,623

(22) Filed: Jul. 8, 2019

(65) Prior Publication Data

US 2020/0042767 A1 Feb. 6, 2020

Related U.S. Application Data

(60) Provisional application No. 62/712,990, filed on Aug. 1, 2018.

(51) Int. Cl.
*G06K 9/00* (2006.01)
*F21V 8/00* (2006.01)
*H01L 27/146* (2006.01)

(52) U.S. Cl.
CPC ........ *G06K 9/0004* (2013.01); *G02B 6/0018* (2013.01); *G06K 9/0008* (2013.01); *G06K 9/00046* (2013.01); *H01L 27/14621* (2013.01)

(58) Field of Classification Search
CPC .......... G06K 9/00006; G06K 9/0004; G06K 9/00013; G06K 9/00046
See application file for complete search history.

(56) References Cited

U.S. PATENT DOCUMENTS

| | | | |
|---|---|---|---|
| 9,513,480 B2 | 12/2016 | Saarikko et al. | |
| 10,216,975 B1 * | 2/2019 | He | G06K 9/2018 |
| 10,387,710 B2 * | 8/2019 | Chen | G03H 1/0248 |
| 2017/0255813 A1 | 9/2017 | Chen et al. | |
| 2017/0372113 A1 | 12/2017 | Zhang et al. | |
| 2018/0357462 A1 * | 12/2018 | Mackey | G06F 1/1684 |

FOREIGN PATENT DOCUMENTS

| | | |
|---|---|---|
| CN | 105389552 | 3/2016 |
| CN | 106940598 | 7/2017 |
| TW | I534717 | 5/2016 |
| TW | M1575562 | 3/2019 |

OTHER PUBLICATIONS

"Office Action of Taiwan Counterpart Application", dated Mar. 25, 2020, p. 1-p. 4.

* cited by examiner

*Primary Examiner* — Koosha Sharifi-Tafreshi
(74) *Attorney, Agent, or Firm* — JCIPRNET

(57) ABSTRACT

An under-screen fingerprint identification system includes an image sensing element, a display element, a translucent cover, and a Bragg polarization grating. The display element is disposed on the image sensing element. The translucent cover is disposed on the display element, and the display element is located between the translucent cover and the image sensing element. The translucent cover has a first surface and a second surface opposite to each other, and the first surface is farther away from the display element than the second surface. The Bragg polarization grating is disposed on the second surface of the translucent cover.

14 Claims, 2 Drawing Sheets

UNDER-SCREEN FINGERPRINT IDENTIFICATION SYSTEM

CROSS-REFERENCE TO RELATED APPLICATION

This application claims the priority benefit of U.S. provisional application Ser. No. 62/712,990, filed on Aug. 1, 2018. The entirety of the above-mentioned patent application is hereby incorporated by reference herein and made a part of this specification.

BACKGROUND

Technical Field

The disclosure relates to an optical device; more particularly, the disclosure relates to an under-screen fingerprint identification system.

Description of Related Art

The existing mobile devices are characterized mainly by full screen and slim border. The fingerprint reader used on a mobile device has evolved from a fingerprint reader to which a capacitive fingerprint identification technology is applied to an optical or ultrasonic fingerprint reader.

According to the operating principle of the optical fingerprint reader, the fingerprint is irradiated by a light source to obtain the shape and the features of the fingerprint according to the different intensities of reflective beams corresponding to ridges and valleys of the fingerprint. The light source of the fingerprint reader may be a light source of a display module or an external light source disposed outside the display module. The mobile device that cannot use the light source of the display module is required to use the external light source. Accordingly, how to appropriately use the external light source together with other components of the fingerprint reader has become an important issue.

SUMMARY

The disclosure provides an under-screen fingerprint identification system with good performance.

In an embodiment of the disclosure, an under-screen fingerprint identification system includes an image sensing element, a display element disposed on the image sensing element, a translucent cover disposed on the display element, and a Bragg polarization grating, wherein the display element is located between the translucent cover and the image sensing element, the translucent cover has a first surface and a second surface opposite to each other, the first surface is farther away from the display element than the second surface, and the Bragg polarization grating is disposed on the second surface of the translucent cover.

In an embodiment of the disclosure, an under-screen fingerprint identification system includes an image sensing element, a display element disposed on the image sensing element, a translucent cover disposed on the display element, a light source, and a band pass filter element. The display element is located between the translucent cover and the image sensing element. The translucent cover has a first surface, a second surface opposite to the first surface, and a light incident surface connected between the first surface and the second surface. The light source is adapted to emit a sensing beam, and the sensing beam includes a first portion having a first wavelength range and a second portion having a second wavelength range. The band pass filter element is disposed on the light incident surface of the translucent cover, wherein the first portion of the sensing beam having the first wavelength range enters the translucent cover passing through the band pass filter element, and the second portion of the sensing beam having the second wavelength range is blocked by the band pass filter element.

According to an embodiment of the disclosure, the under-screen fingerprint identification system further includes a light source adapted to emit a sensing beam, wherein the sensing beam is transmitted toward the first surface of the translucent cover after the sensing beam is deflected by the Bragg polarization grating.

According to an embodiment of the disclosure, the Bragg polarization grating of the under-screen fingerprint identification system is disposed between the light source and the second surface of the translucent cover.

According to an embodiment of the disclosure, the sensing beam is a linear polarization beam, and a polarization direction of the linear polarization beam is parallel to a direction of a penetration axis of the Bragg polarization grating.

According to an embodiment of the disclosure, the Bragg polarization grating of the under-screen fingerprint identification system is a dispersed polymer material film layer.

According to an embodiment of the disclosure, the under-screen fingerprint identification system further includes a backlight module disposed between the display element and the image sensing element, and a portion of the backlight module corresponding to the image sensing element has a plurality of through holes.

According to an embodiment of the disclosure, the under-screen fingerprint identification system further includes a control element electrically coupled to the display element and the backlight module. When the object to be identified is disposed on the first surface of the translucent cover, the control element turns off the backlight module.

According to an embodiment of the disclosure, when the object to be identified is disposed on the first surface of the translucent cover, the control element makes the display element be in a light penetrable state.

According to an embodiment of the disclosure, the sensing beam has a first full width at half maximum (FWHM), a transmission spectrum of the band pass filter element has a second FWHM, and the second FWHM is less than the first FWHM.

According to an embodiment of the disclosure, the first surface of the translucent cover is farther away from the display element than the second surface of the translucent cover, an included angle $\theta$ is between the light incident surface of the translucent cover and the first surface of the translucent cover, and $0° < \theta < 90°$.

In view of the above, the under-screen fingerprint identification system provided in one or more embodiments of the disclosure includes the translucent cover and the Bragg polarization grating, wherein the translucent cover has the first surface and the second surface opposite to each other, and the Bragg polarization grating is disposed on the first surface of the translucent cover. Through the Bragg polarization grating, the incidence angle of the sensing beam incident to the second surface of the translucent cover can be adjusted, so as to increase the amount of total reflection of the sensing beam by the first surface and the second surface of the translucent cover. As such, the object to be identified can be fully irradiated.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
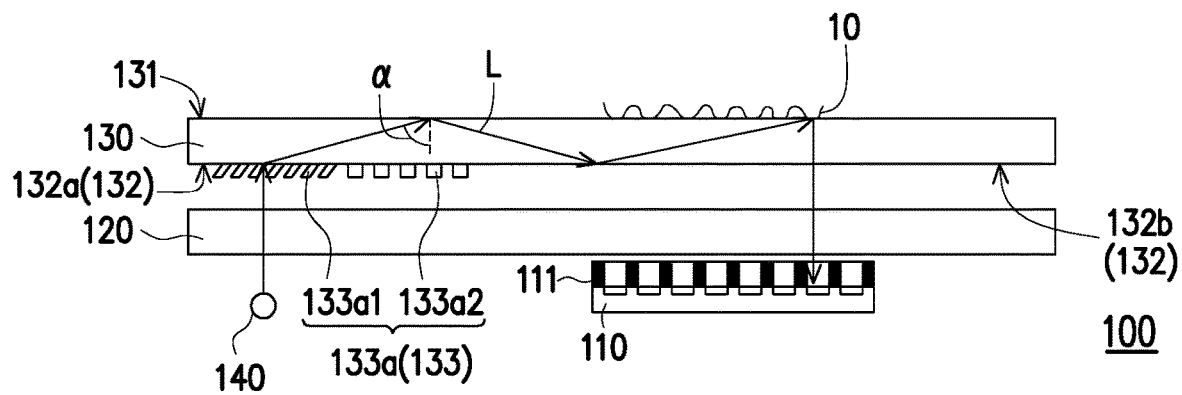
FIG. 1 is a schematic cross-sectional view of an under-screen fingerprint identification system according to an embodiment of the disclosure.

Descriptions of the invention are given with reference to the exemplary embodiments illustrated with accompaned drawings, wherein same or similar parts are denoted with same reference numerals. Wherever possible, the same reference numbers are used in the drawings and the description to refer to the same or like parts.

Figure 2:
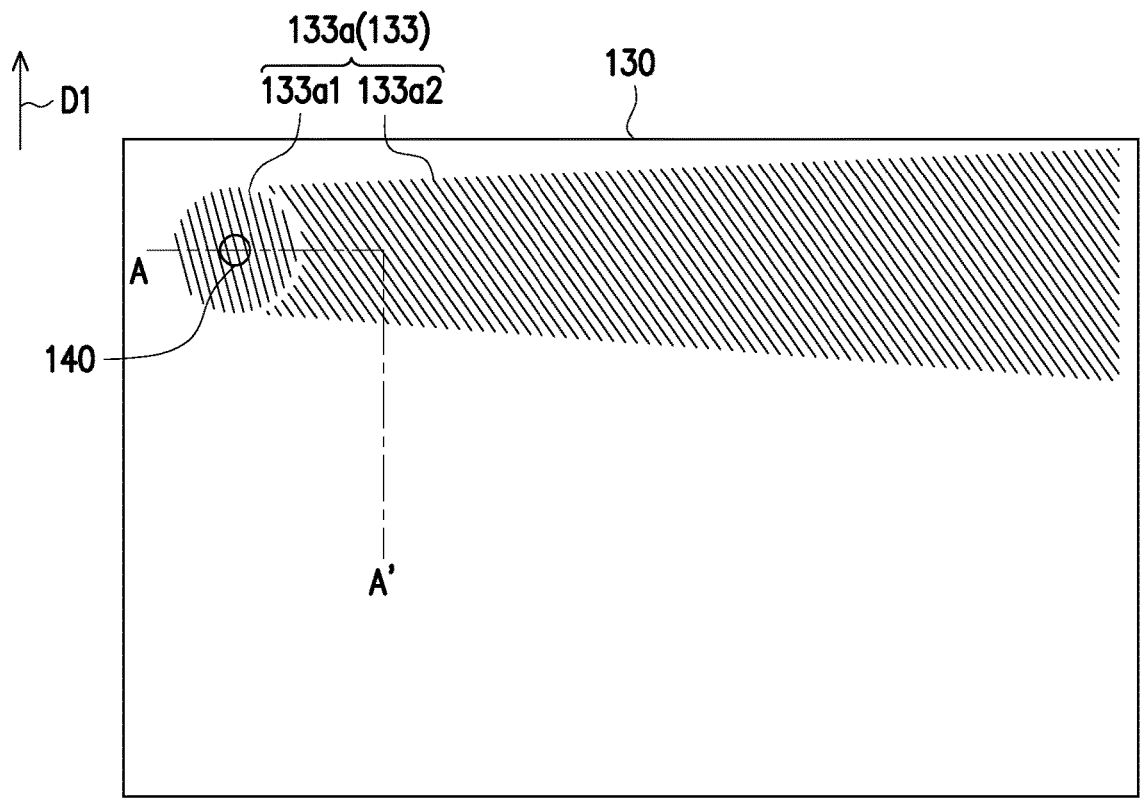
FIG. 2 is a schematic top perspective view of the under-screen fingerprint identification system according to the embodiment depicted in FIG. 1.

FIG. 1 is a schematic cross-sectional view of an under-screen fingerprint identification system 100 according to an embodiment of the disclosure. FIG. 2 is a schematic top perspective view of the under-screen fingerprint identification system 100 according to the embodiment depicted in FIG. 1. FIG. 1 is a schematic cross-sectional view of the under-screen fingerprint identification system 100 depicted in FIG. 2 along a sectional line A-A'. With reference to FIG. 1 and FIG. 2, the under-screen fingerprint identification system 100 includes an image sensing element 110, a display element 120, a translucent cover 130, and a Bragg polarization grating 133. The display element 120 is disposed on the image sensing element 110. The translucent cover 130 is disposed on the display element 120, and the display element 120 is located between the translucent cover 130 and the image sensing element 110. The translucent cover 130 has a first surface 131 and a second surface 132 opposite to the first surface 131. The first surface 131 is farther away from the display element 120 than the second surface 132. The Bragg polarization grating 133 is disposed on the second surface 132 of the translucent cover 130.

Through the Bragg polarization grating 133, the sensing beam L can be directionally guided into the translucent cover 130. Specifically, when the sensing beam L passes through the Bragg polarization grating 133, the sensing beam L is deflected by the Bragg polarization grating 133 and is thus transmitted to the first surface 131 of the translucent cover 130 at a relatively large incidence angle, so as to increase the total reflection amount of the sensing beam L by the first surface 131 and the second surface 132 of the translucent cover 130. As such, an object 10 to be identified can be fully irradiated. In the present embodiment, the object 10 to be identified is a biological feature including but not limited to fingerprints and vein.

Please refer to FIG. 1. According to the present embodiment, the under-screen fingerprint identification system 100 can further include a light source 140 disposed on one side of the display element 120. The display element 120 is disposed between the light source 140 and the translucent cover 130. The Bragg polarization grating 133 is disposed between the light source 140 and the second surface 132 of the translucent cover 130. The light source 140 is adapted to emit the sensing beam L. The sensing beam L is sequentially deflected by the Bragg polarization grating 133 and reflected by the first surface 131 of the translucent cover 130, and the sensing beam L then irradiates the object 10 to be identified. For instance, the light source 140 provided in the present embodiment may be but is not limited to a light emitting diode (LED), for instance. The Bragg polarization grating 133 can diffract the sensing beam L emitted by the light source 140, so that the sensing beam L is transmitted to the first surface 131 of the translucent cover 130 at a relatively large incidence angle. Thereby, the amount of total reflection of the sensing beam L by the first surface 131 and the second surface 132 of the translucent cover 130 can be increased. As such, the object 10 to be identified can be fully irradiated.

In particular, the second surface 132 of the translucent cover 130 in the present embodiment can include a light incident portion 132a close to the light source 140 and a sensing portion 132b away from the light source 140, the Bragg polarization grating 133 is disposed at the light incident portion 132a of the second surface 132 of the translucent cover 130, and the light source 140 is disposed below the Bragg polarization grating 133.

For instance, in the present embodiment, the display element 120 can be a self-illuminating display element, which may be but may not be limited to an organic LED (OLED) display panel, a micro-LED display panel, or a mini-LED display panel. This should however not be construed as a limitation in the disclosure; according to other embodiments, the display element 120 may also be a non-self-illuminating display element including but not limited to a liquid crystal display (LCD) panel.

The image sensing element 110 is configured to receive the sensing beam L reflected (or diffused) by the object 10 to be identified and reflected by a portion of the first surface 131 of the translucent cover 130, so as to obtain an image corresponding to the object 10 to be identified. Specifically, after the sensing beam L emitted by the light source 140 is deflected by the Bragg polarization grating 133 and enters the translucent cover 130 through the light incident portion 132a of the translucent cover 130, a portion of the sensing beam L can be totally reflected in the translucent cover 130 until being diffused by the object 10 to be identified on the first surface 131. After the sensing beam L is diffused by the object 10 to be identified, a portion of the sensing beam L can be transmitted to the image sensing element 110 passing through the translucent cover 130 and a translucent region of the display element 120. As such, the image sensing element 110 can obtain an image corresponding to the object 10 to be identified. For instance, the image sensing element 110 provided in the present embodiment can be a complementary metal oxide semiconductor image sensor (CMOS image sensor, CIS) or a charge coupled device (CCD), which should however not be construed as a limitation in the disclosure.

In the present embodiment, the under-screen fingerprint identification system 100 can optionally include a beam collimator 111 disposed between the image sensing element 110 and the display element 120. Through the beam collimator 111, the issue of cross talk can be solved, and the imaging quality of the under-screen fingerprint identification system 100 can be improved.

In the present embodiment, the sensing beam L may be a linear polarization beam, which may be but may not be limited to an electromagnetic wave in a transverse magnetic (TM) mode. A polarization direction D1 of the sensing beam L is substantially parallel to a penetration axis of the Bragg polarization grating 133. As such, the amount of the sensing beam L reflected by the Bragg polarization grating 133 can be reduced, and the visual experience of users who use the under-screen fingerprint identification system 100 can be improved.

Besides, in the present embodiment, the translucent cover 130 can be made of a material with a high refraction index (including but not limited to the refraction index greater than 1.5, for instance), so as to increase the total reflection amount of the sensing beam L by the first surface 131 and/or the second surface 132, and thereby the translucent cover 130 can better transmit the sensing beam L.

In the present embodiment, the Bragg polarization grating 133 of the under-screen fingerprint identification system 100 can be a dispersed polymer material film layer 133a. The dispersed polymer material film layer 133a can be disposed on the light incident portion 132a of the second surface 132 of the translucent cover 130, which should however not be construed as a limitation in the disclosure.

Please refer to FIG. 1 and FIG. 2 again. In the present embodiment, the dispersed polymer material film layer 133a can further include a first region 133a1 and a second region 133a2, wherein the light source 140 can be disposed corresponding to the first region 133a1. When the sensing beam L emitted by the light source 140 passes through the first region 133a1 of the dispersed polymer material film layer 133a, the sensing beam L is deflected by the first region 133a1 of the dispersed polymer material film layer 133a, so that the sensing beam L is transmitted to the first surface 131 of the translucent cover 130 at a relatively large incidence angle α. The portion of the beam entering the translucent cover 130 is totally reflected by the first surface 131 and is reflected to the second region 133a2 of the dispersed polymer material film layer 133a. The sensing beam L reflected to the second region 133a2 is subject to the second region 133a2 of the dispersed polymer material film layer 133a and is thus further deflected, so that the sensing beam incident to the second region 133a2 can be spread to everywhere on the sensing portion 132b of the translucent cover 130 through the deflection of the second region 133a2 of the dispersed polymer material film layer 133a. After the sensing beam L emitted by the light source 140 having the characteristics of the point light source is subject to the Bragg polarization grating 133, the effect similar to that achieved by a linear light source can be accomplished, so that the distribution of the sensing beam L between the first surface 131 and the second surface 132 of the translucent cover 130 becomes more uniform, and the object 10 to be identified can then be fully irradiated.

Figure 3:
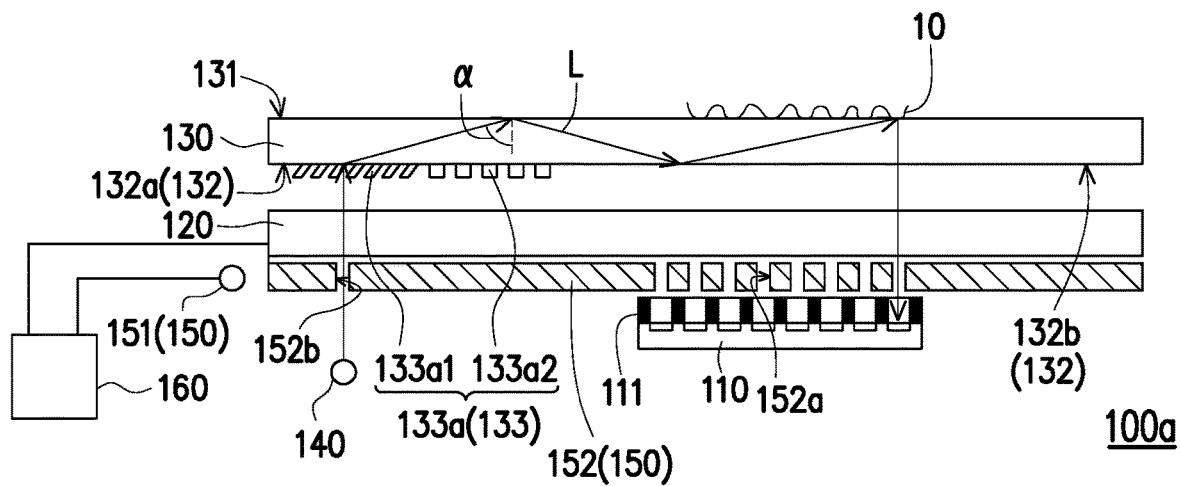
FIG. 3 is a schematic cross-sectional view of an under-screen fingerprint identification system according to another embodiment of the disclosure.

FIG. 3 is a schematic cross-sectional view of an under-screen fingerprint identification system 100a according to another embodiment of the disclosure. With reference to FIG. 3, the under-screen fingerprint identification system 100a provided in the present embodiment is similar to the under-screen fingerprint identification system 100 depicted in FIG. 1 and FIG. 2, while the difference therebetween lies in that the display element 120 of the under-screen fingerprint identification system 100a provided in the present embodiment is a non-self-illuminating element, and the under-screen fingerprint identification system 100a can further include a backlight module 150 disposed between the display element 120 and the image sensing element 110. Specifically, the backlight module 150 can include a backlight source 151 and a light guide plate 152. A portion of the light guide plate 152 of the backlight module 150 corresponding to the image sensing element 110 can have a plurality of through holes 152a. After the sensing beam L is diffused by the object 10 to be identified, a portion of the sensing beam L can be transmitted to the image sensing element 110 sequentially passing through the second surface 132 of the translucent cover 130, the translucent region of the display element 120, and the through holes 152a of the light guide plate 152. Besides, the light guide plate 152 of the backlight module 150 is disposed between the Bragg polarization grating 133 and the light source 140. A portion of the light guide plate 152 corresponding to the light source 140 can have through holes 152b, so that the sensing beam L emitted by the light source 140 can be transmitted to the Bragg polarization grating 133 by passing through the through holes 152b of the light guide plate 152.

In the present embodiment, the under-screen fingerprint identification system 100a can further include a control element 160 electrically coupled to the display element 120 and the backlight module 150. When the object 10 to be identified is disposed on the first surface 131 of the translucent cover 130, the control element 160 turns off the backlight source 151 of the backlight module 150, so as to prevent an illumination beam (not shown) emitted by the backlight source 151 from disturbing the image sensing element 110 to obtain the image corresponding object 10 to be identified. Besides, when the object 10 to be identified is disposed on the first surface 131 of the translucent cover 130, the control element 160 can further make the display element 120 to be in a light penetrable state, so as to increase the amount of the sensing beam L diffused by the object 10 to be identified arriving at the image sensing element 110 passing through the display element 120.

Figure 4:
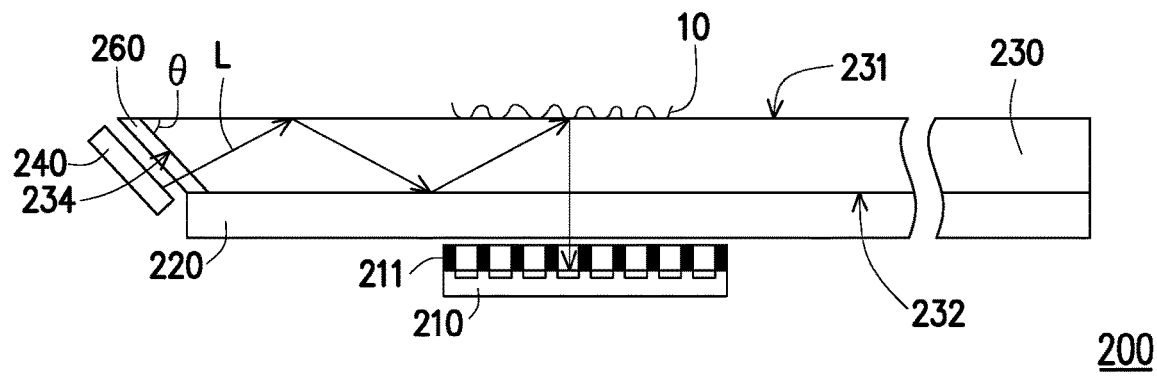
FIG. 4 is a schematic cross-sectional view of an under-screen fingerprint identification system according to still another embodiment of the disclosure.

FIG. 4 is a schematic cross-sectional view of an under-screen fingerprint identification system 200 according to still another embodiment of the disclosure. With reference to FIG. 4, an under-screen fingerprint identification system 200 provided in the present embodiment includes an image sensing element 210, a display element 220, a translucent cover 230, a light source 240, and a band pass filter element 260. The display element 220 is disposed on the image sensing element 210. The translucent cover 230 is disposed on the display element 220, and the display element 220 is located between the translucent cover 230 and the image sensing element 210. The translucent cover 230 has a first surface 231, a second surface 232 opposite to the first surface 231, and a light incident surface 234 connected between the first surface 231 and the second surface 232. The first surface 231 is farther away from the display element 220 than the second surface 232. In the present embodiment, an included angle θ can optically exist between the light incident surface 234 and the first surface 231, wherein 0°<θ<90°. That is, the light incident surface 234 can be inclined relative to the first surface 231. When the sensing beam L passes through the inclined light incident surface 234, the sensing beam L is deflected toward the first surface 231 of the translucent cover 230 and enters the first surface 231 of the translucent cover 230 at a relatively large incidence angle. Thereby, the total reflection amount of the sensing beam L by the first surface 231 and the second surface 232 of the translucent cover 230 can be increased, and the object 10 to be identified can be fully irradiated.

The light source 240 is suitable for emitting a sensing beam L. The sensing beam L includes a first portion having a first wavelength range and a second portion having a second wavelength range. The band pass filter element 260 is disposed on the light incident surface 234 of the translucent cover 230. The first portion of the sensing beam L having the first wavelength range enters the translucent cover 230 passing through the band pass filter element 260, and the second portion of the sensing beam L having the second wavelength range is blocked by the band pass filter element 260. In the present embodiment, the sensing beam L has a first full width at half maximum (FWHM), a transmission spectrum of the band pass filter element 260 has a second FWHM, and the second FWHM is less than the first FWHM.

Through the light filtering effects of the band pass filter element 260, the portion of the sensing beam L transmitted toward the object 10 to be identified has a relatively narrow FWHM. As such, when the sensing beam L is deflected or reflected by a point on the first surface 231 of the translucent cover 230 or the object 10 to be identified, even in case of large differences in the wavelengths of different components of the sensing beam L, the sensing beam L deflected or reflected by the same point is less possible to be transmitted to different light sensing regions of the image sensing element 210, so that the problem of blurred images can be improved.

For instance, in the present embodiment, the light source 240 can be a linear light source including but not limited to an LED light bar, for instance. The band pass filter element 260 can be coated on the light incident surface 234, which should however not be construed as a limitation in the disclosure. The display element 220 provided in the present embodiment is, for instance, an OLED or any other self-illuminating element, which should however not be construed as a limitation in the disclosure.

Figure 5:
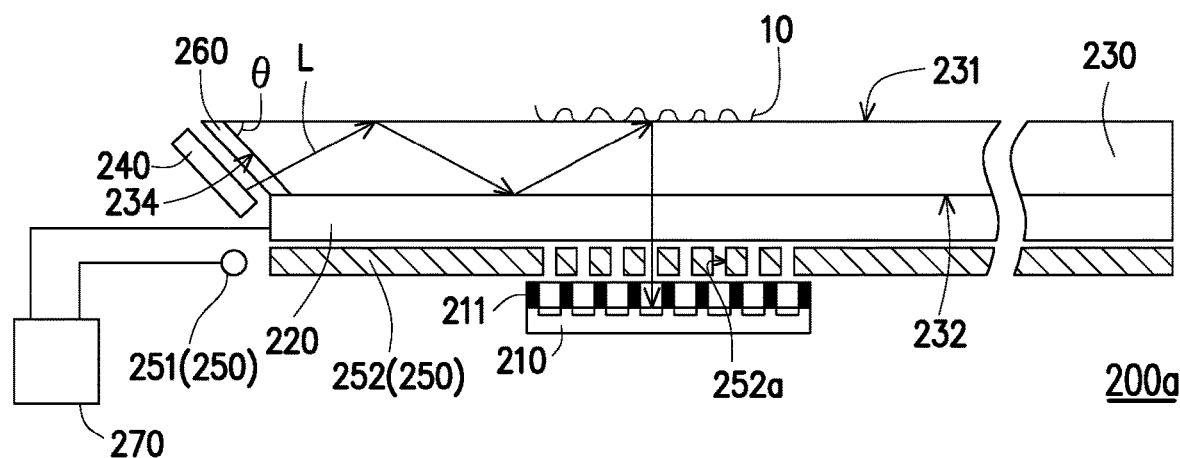
FIG. 5 is a schematic cross-sectional view of an under-screen fingerprint identification system according to still another embodiment of the disclosure.

FIG. 5 is a schematic cross-sectional view of an under-screen fingerprint identification system 200a according to still another embodiment of the disclosure. With reference to FIG. 5, the under-screen fingerprint identification system 200a provided in the present embodiment and the under-screen fingerprint identification system 200 depicted in FIG. 4 are similar, while the difference therebetween lies in that the display element 220 of the under-screen fingerprint identification system 200a provided in the present embodiment is a non-self-illuminating element, and the under-screen fingerprint identification system 200a provided in the present embodiment further includes a backlight module 250 disposed between the display element 220 and the image sensing element 210. In the present embodiment, the display element 220 can be an LCD panel or another non-self-illuminating element. Particularly, the backlight module 250 can include the backlight source 251 and the light guide plate 252, wherein a portion of the light guide plate 252 of the backlight module 250 corresponding to the image sensing element 210 can have a plurality of through holes 252a, so that the sensing beam L diffused by the object 10 to be identified can be transmitted to the image sensing element 210 by passing through the through holes 252a of the light guide plate 252.

In the present embodiment, the under-screen fingerprint identification system 200a can further optionally include a control element 270 electrically coupled to the display element 220 and the backlight module 250. When the object 10 to be identified is disposed on the first surface 231 of the translucent cover 230, the control element 270 turns off the backlight source 251 of the backlight module 250, so as to prevent an illumination beam (not shown) emitted by the backlight source 251 from disturbing the image sensing element 210 to obtain the image corresponding object 10 to be identified. Besides, when the object 10 to be identified is disposed on the first surface 231 of the translucent cover 230, the control element 270 can further make the display element 220 to be in a light penetrable state, so as to increase the amount of the sensing beam L diffused by the object 10 to be identified arriving at the image sensing element 210 passing through the translucent region of the display element 220.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An under-screen fingerprint identification system comprising:
   an image sensing element;
   a display element disposed on the image sensing element;
   a translucent cover disposed on the display element, wherein the display element is located between the translucent cover and the image sensing element, the translucent cover has a first surface and a second surface opposite to each other, and the first surface is farther away from the display element than the second surface; and
   a Bragg polarization grating disposed on the second surface of the translucent cover.

2. The under-screen fingerprint identification system according to claim 1, further comprising:
   a light source adapted to emit a sensing beam, wherein the sensing beam is transmitted toward the first surface of the translucent cover after the sensing beam is deflected by the Bragg polarization grating.

3. The under-screen fingerprint identification system according to claim 2, wherein the Bragg polarization grating is disposed between the display element and the second surface of the translucent cover.

4. The under-screen fingerprint identification system according to claim 2, wherein the sensing beam is a linear polarization beam, and a polarization direction of the linear polarization beam is parallel to a direction of a penetration axis of the Bragg polarization grating.

5. The under-screen fingerprint identification system according to claim 1, wherein the Bragg polarization grating is a dispersed polymer material film layer.

6. The under-screen fingerprint identification system according to claim 1, further comprising:
   a backlight module disposed between the display element and the image sensing element, wherein a portion of the backlight module corresponding to the image sensing element has a plurality of through holes.

7. The under-screen fingerprint identification system according to claim 6, further comprising:
   a control element electrically coupled to the display element and the backlight module;
   wherein when an object to be identified is disposed on the first surface of the translucent cover, the control element turns off the backlight module.

8. The under-screen fingerprint identification system according to claim 7, wherein when the object to be identified is disposed on the first surface of the translucent cover, the control element makes the display element be in a light penetrable state.

9. An under-screen fingerprint identification system comprising:
   an image sensing element;
   a display element disposed on the image sensing element;
   a translucent cover disposed on the display element, wherein the display element is located between the translucent cover and the image sensing element, the translucent cover has a first surface, a second surface opposite to the first surface, and a light incident surface connected between the first surface and the second surface; and
   a light source adapted to emit a sensing beam, the sensing beam comprising a first portion having a first wavelength range and a second portion having a second wavelength range; and
   a band pass filter element disposed on the light incident surface of the translucent cover, wherein the first portion of the sensing beam having the first wavelength range enters the translucent cover passing through the band pass filter element, and the second portion of the sensing beam having the second wavelength range is blocked by the band pass filter element.

10. The under-screen fingerprint identification system according to claim 9, wherein the sensing beam has a first full width at half maximum, a transmission spectrum of the band pass filter element has a second full width at half maximum, and the second full width at half maximum is less than the first full width at half maximum.

11. The under-screen fingerprint identification system according to claim 9, wherein the first surface is farther away from the display element than the second surface, an included angle $\theta$ is between the light incident surface and the first surface, and $0°<\theta<90°$.

12. The under-screen fingerprint identification system according to claim 9, further comprising:
   a backlight module disposed between the display element and the image sensing element, wherein a portion of the backlight module corresponding to the image sensing element has a plurality of through holes.

13. The under-screen fingerprint identification system according to claim 12, further comprising:
   a control element electrically coupled to the display element and the backlight module;
   wherein when an object to be identified is disposed on the first surface of the translucent cover, the control element turns off the backlight module.

14. The under-screen fingerprint identification system according to claim 13, wherein when the object to be identified is disposed on the first surface of the translucent cover, the control element makes the display element be in a light penetrable state.

* * * * *